US007541630B2

(12) United States Patent
Han

(10) Patent No.: US 7,541,630 B2
(45) Date of Patent: Jun. 2, 2009

(54) CMOS IMAGE SENSOR AND METHOD FOR MANUFACTURING THE SAME

(75) Inventor: Chang Hun Han, Icheon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 53 days.

(21) Appl. No.: 11/613,224

(22) Filed: Dec. 20, 2006

(65) Prior Publication Data

US 2007/0145439 A1   Jun. 28, 2007

(30) Foreign Application Priority Data

Dec. 28, 2005   (KR)  ...................... 10-2005-0132484

(51) Int. Cl.
*H01L 31/113* (2006.01)
*H01L 21/00* (2006.01)

(52) U.S. Cl. .............................. 257/294; 257/E27.134; 257/E21.632; 438/70

(58) Field of Classification Search ................. 257/414, 257/428, 431, 432, 433, 434, 435, 436, 213, 257/288, 290, 291, 292, 293, 294, E21.616, 257/E21.632, E27.133, E27.134; 438/48, 438/57, 69, 70
See application file for complete search history.

(56) References Cited

U.S. PATENT DOCUMENTS 6,215,536 B1 * 4/2001 Ebihara et al. ................. 349/86
6,379,992 B2 * 4/2002 Jo ................................. 438/70
2003/0092284 A1 * 5/2003 Huang et al. ................. 438/763
2006/0081898 A1 * 4/2006 Wang et al. ................... 257/291
2006/0113622 A1 * 6/2006 Adkisson et al. ............. 257/443
2006/0118698 A1 * 6/2006 Yu ........................... 250/208.1

FOREIGN PATENT DOCUMENTS

| CN | 1794463 | 6/2006 |
| JP | 07-203317 | 8/1995 |
| KR | 10-1996-0029047 | 4/1998 |

* cited by examiner

*Primary Examiner*—Evan Pert
*Assistant Examiner*—Kevin Quinto
(74) *Attorney, Agent, or Firm*—Saliwanchik, Lloyd & Saliwanchik

(57) ABSTRACT

A CMOS image sensor and method of manufacturing the same are provided. In one embodiment, the CMOS image sensor includes: an interlayer dielectric layer formed on a semiconductor substrate including a plurality of photodiodes and transistors; a plurality of color filter isolation layers formed on the interlayer dielectric layer; a color filter layer comprising a first color filter, a second color filter, and a third color filter formed on the interlayer dielectric layer, wherein a portion of the first color filter and a portion of the second color filter are formed on one of the plurality of color filter isolation layers, and wherein a portion of the second color filter and a portion of the third color filter are formed on another of the plurality of color filter isolation layers; and microlenses formed on the color filter layer.

16 Claims, 8 Drawing Sheets

US 7,541,630 B2

CMOS IMAGE SENSOR AND METHOD FOR MANUFACTURING THE SAME

RELATED APPLICATION(S)

This application claims priority under 35 U.S.C. §119(e) of Korean Patent Application No. 10-2005-0132484 filed Dec. 28, 2005, which is incorporated herein by reference in its entirety.

FIELD OF THE INVENTION

The present invention relates to a CMOS image sensor and a method for manufacturing the same.

BACKGROUND OF THE INVENTION

In general, an image sensor refers to a semiconductor device for converting an optical image into an electrical signal. Image sensors can be classified as a charge coupled device (CCD) image sensor or a complementary metal oxide semiconductor (CMOS) image sensor. The CCD image sensor includes metal-oxide-silicon (MOS) capacitors that are formed very close to each other, where charge carriers are stored in and transferred from the capacitors.

Meanwhile, a CMOS image sensor is a device employing a switching mode to sequentially detect an output by providing MOS transistors corresponding to the number of pixels through a CMOS technology that uses peripheral devices, such as a control circuit and a signal processing circuit.

A charge coupled device (CCD) has various disadvantages such as a complicated drive mode and high power consumption. Also, the CCD requires many steps of mask processes, making the process for the CCD complicated, and it is difficult to integrate a signal processing circuit onto a single chip of the CCD. Recently, to overcome these disadvantages, CMOS image sensors using a sub-micron CMOS manufacturing technology have been studied and developed.

The CMOS image sensor includes a photodiode and a MOS transistor in each unit pixel to sequentially detect the signal by switching mode, thereby realizing the images. Since the CMOS image sensor makes use of the CMOS manufacturing technology, the CMOS image sensor has low power consumption and simplifies the manufacturing process thereof. That is, the CMOS sensor manufacturing process can be achieved by using about 20 masks, while the CCD process requires 30 to 40 masks. Also, many signal processors can be integrated onto a single chip of the CMOS image sensor, so the CMOS image sensor is spotlighted as a next-generation image sensor. Accordingly, the CMOS image sensor is used in various applications such as digital still camera (DSC), PC camera, mobile camera and so forth.

Meanwhile, the CMOS image sensors are classified as 3T-type, 4T-type, or 5T-type CMOS image sensors in accordance with the number of transistors formed in a unit pixel. The 3T-type CMOS image sensor includes one photodiode and three transistors, and the 4T-type CMOS image sensor includes one photodiode and four transistors. Hereinafter, description will be made in relation to a layout of a unit pixel of the 3T-type CMOS image sensor.

FIG. 1 is an equivalent circuit view of the common 3T-type CMOS image sensor, and FIG. 2 is a layout view illustrating the unit pixel of the common 3T-type CMOS image sensor.

As shown in FIG. 1, the unit pixel of the common 3T CMOS image sensor includes one photodiode PD and three nMOS transistors T1, T2 and T3. A cathode of the photodiode PD is connected to the drain of the first nMOS transistor T1 and the gate of the second nMOS transistor T2.

In addition, the sources of the first and second nMOS transistors T1 and T2 are connected to a power line that feeds a reference voltage VR, and the gate of the first nMOS transistor T1 is connected to a reset line that feeds a reset signal RST.

Also, the source of the third nMOS transistor T3 is connected to the drain of the second nMOS transistor T2, the drain of the third nMOS transistor T3 is connected to a reading circuit (not shown) through a signal line, and the gate of the third nMOS transistor T3 is connected to a column select line that feeds a selection signal SLCT.

Therefore, the first nMOS transistor T1 is referred to as a reset transistor Rx, the second nMOS transistor as a drive transistor Dx, and the third nMOS transistor T3 as a selection transistor Sx.

As shown in FIG. 2, an active area 10 is defined on the unit pixel of the common 3T CMOS image sensor, so that one photodiode 20 is formed in a large-width part of the active area 10, and gate electrodes 120, 130 and 140 of three transistors are formed overlapping the remaining parts of the active area 10.

That is, the reset transistor Rx incorporates the gate electrode 120, the drive transistor Dx incorporates the gate electrode 130, and the select transistor Sx incorporates with the gate electrode 140.

Here, dopants are implanted into the active area 10 of each transistor, excluding below lower portions of the gate electrodes 120, 130 and 140, thereby forming a source and drain area of each transistor.

Thus, a power supply voltage Vdd may be applied to the source/drain area formed between the reset transistor Rx and the drive transistor Dx, and the source/drain area formed at one side of the select transistor Sx is connected to a reading circuit (not shown).

Although not shown in the drawings, the gate electrodes 120, 130 and 140 are connected to the signal lines for Rx, Dx, and Sx, respectively. Each signal line has a pad at one end thereof, and is connected to an external driving circuit.

FIG. 3 is a sectional view showing a conventional CMOS image sensor.

As shown in FIG. 3, an isolation area and an active area having a photodiode area and a transistor area are defined on the P++ type semiconductor substrate 100, and a P− type epitaxial layer 101 is grown on the semiconductor substrate 100. Then, a field oxide layer 102 is formed on the isolation area of the semiconductor substrate 100 to separate the input areas of green, red and blue light, and an N− type diffusion area 103 is formed on the photodiode area of the semiconductor substrate 100.

Thereafter, gate insulating layers 104 and gate electrodes 105 are formed on the transistor area of the semiconductor substrate 100, and insulating sidewalls 106 are formed at both sides of the gate electrode 105. Then, a diffusion barrier 107 is formed on the gate electrode 105.

Then, a first interlayer dielectric layer 108 is formed on the diffusion barrier 107, and various metal interconnections 109 are formed on the first interlayer dielectric layer 108. The metal interconnections 109 are spaced apart from each other by a predetermined interval.

In addition, a second interlayer dielectric layer 110 having a thickness of about 4000 Å is formed on the entire surface of the semiconductor substrate 100, including the metal interconnections 109, and a first planar layer 111 is formed on the second interlayer dielectric layer 110. Then, the red (R), green (G) and blue (B) color filter layers 112 are formed on the first planar layer 111 corresponding to each N- type diffusion area 103.

The color filter layers 112 include three colors of R, G and B, in which the boundaries thereof are always overlapped or the thickness of the three color filters are non-uniformly formed.

In other words, as shown in FIG. 3, the R color filter layer has the largest thickness and the G color filter layer has the smallest thickness.

In addition, a second planar layer 113 is formed on the entire surface of the semiconductor substrate 100 including the color filter layers 112, and the microlenses 114 are formed to correspond to each color filter layer 112.

Here, reference numeral 115, not yet described, is a source and drain impurity area of the transistor.

However, the conventional CMOS image sensor described above has the following problem.

That is, the color reproduction of blue (B) wavelength is lower than that of other wavelengths, so that, in extreme case, a greenish effect occurs.

The greenish effect refers to a phenomenon incurring an afterimage of green color in the display even though the green color is shifted from the display.

The greenish effect may occur because the green color wavelength reacts prior to the blue color wavelength. To solve this problem, it is necessary to efficiently make the light reaction of the blue color wavelength.

BRIEF SUMMARY

Accordingly, embodiments of the present invention have been made to solve the above problem occurring in the prior art, and an object of embodiments of the present invention is to provide a CMOS image sensor and a method for manufacturing the same, capable of preventing three colors of R, G and B from being overlapped while improving the color reproduction.

An embodiment of present invention provides a CMOS image sensor comprising: an interlayer dielectric layer formed on a semiconductor substrate including a plurality of photodiodes and transistors; first, second and third color filter layers formed on the interlayer dielectric layer, the color filter layers being spaced apart from each other by a predetermined interval; a plurality of color filter isolation layers formed on the interlayer dielectric layer between the color filter layers to separate the color filter layers from each other, wherein a portion of the color filter layer is formed on a top surface of the color filter isolation layer; and microlenses formed on the color filter layers.

Another embodiment of the present invention provides a method for manufacturing a CMOS image sensor, the method comprising the steps of: forming an interlayer dielectric layer on a semiconductor substrate including a plurality of photodiodes and transistors; forming color filter isolation layers on the interlayer dielectric layer, wherein the color filter isolation layers are patterned and spaced apart from each other by a predetermined interval; forming first, second and third color filter layers on the interlayer dielectric layer; and forming microlenses on each color filter layer.

DETAILED DESCRIPTION OF THE INVENTION

Hereinafter, a CMOS image sensor and a method for manufacturing the same according to embodiments of the present invention will be described with reference to the accompanying drawings.

Figure 1:
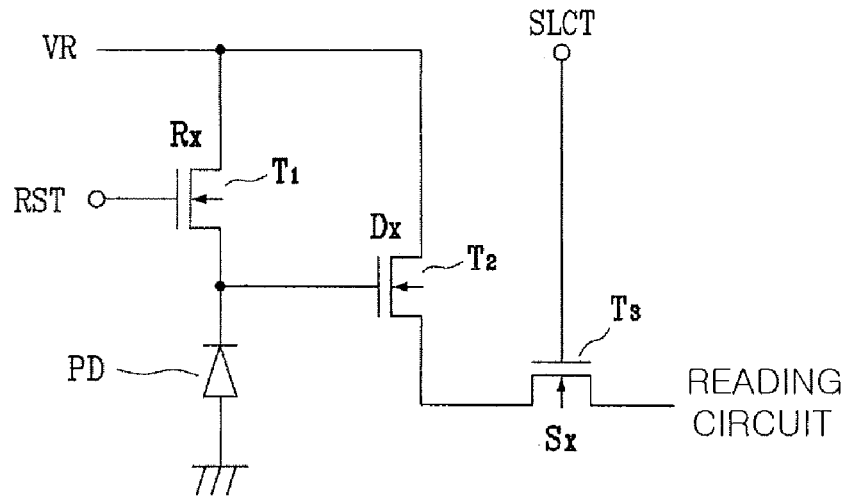
FIG. 1 is an equivalent circuit view of the common 3T-type CMOS image sensor.
Figure 2:
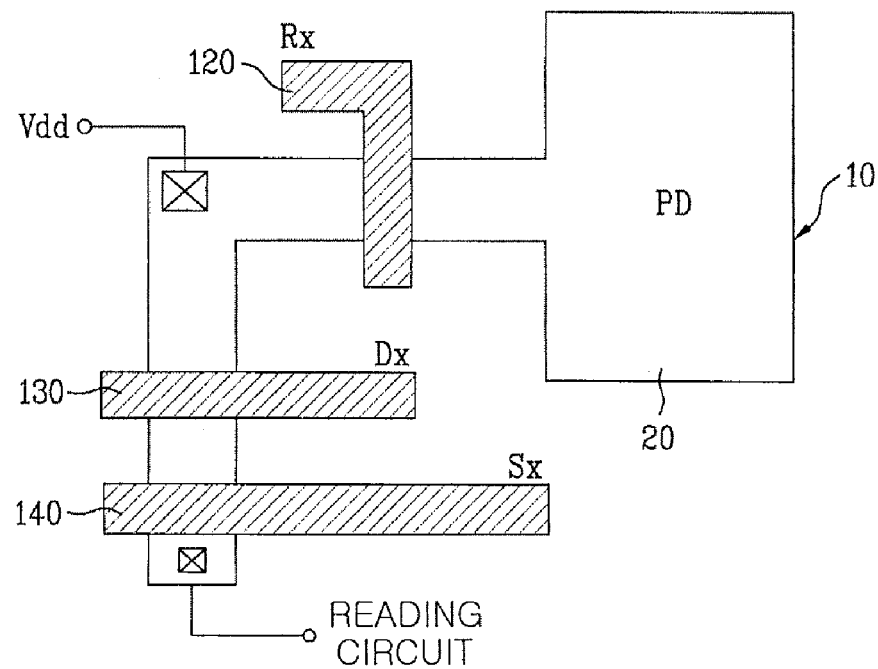
FIG. 2 is a layout view illustrating the unit pixel of the common 3T-type CMOS image sensor.
Figure 3:
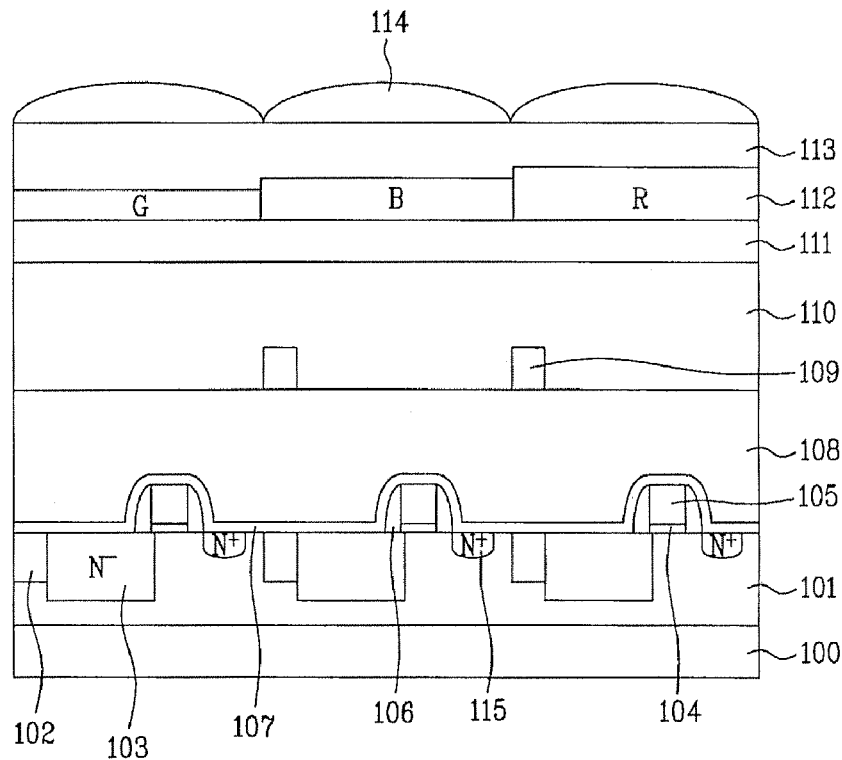
FIG. 3 is a sectional view showing a conventional CMOS image sensor.
Figure 4:
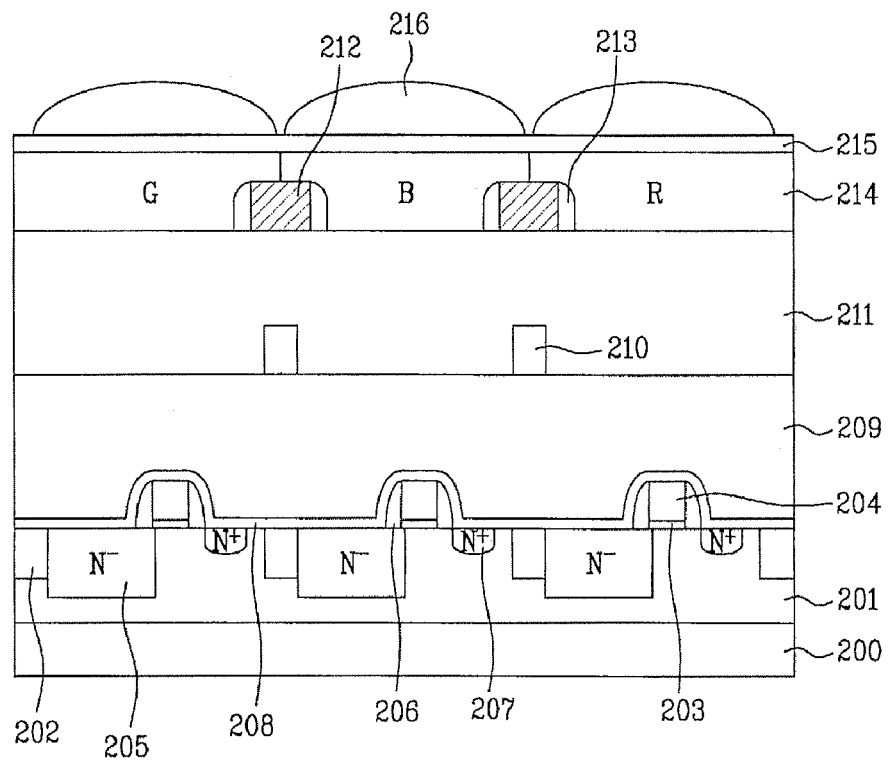
FIG. 4 is a sectional view showing a CMOS image sensor according to a first embodiment of the present invention.

FIG. 4 is a sectional view showing a CMOS image sensor according to a first embodiment of the present invention.

Referring to FIG. 4, an isolation area and an active area having a photodiode area and a transistor area can be defined on a P++ type semiconductor substrate 200, and a P- type epitaxial layer 201 can be grown on the semiconductor substrate 200. Then, an isolation layer 202 can be formed on the isolation area of the semiconductor substrate 200 to separate the incident area of the green, red and blue light, and an N-type diffusion area 205 can be formed on the photodiode area of the semiconductor substrate 200.

In addition, gate insulating layers 203 and gate electrodes 204 can be formed on the transistor area of the semiconductor substrate 200, and gate spacers 206 can be formed at both sides of the gate electrode 204. A diffusion blocking nitride layer 208 can be formed on the entire surface of the semiconductor substrate 200 including the gate electrode 204.

Then, a first interlayer dielectric layer 209 can be formed on the diffusion blocking nitride layer 208, and various metal interconnections 210 can be formed on the first interlayer dielectric layer 209. The metal interconnections 210 can be spaced apart from each other by a predetermined interval.

In addition, a second interlayer dielectric layer 211 can be formed on the entire surface of the semiconductor substrate 200 including the metal interconnections 210, and a plurality of color filter isolation layers 212 can be formed on the second interlayer dielectric layer 211. The color filter isolation layers 212 can be spaced apart from each other by a predetermined interval. In a specific embodiment, the color filter isolation layer 212 includes Undoped Silicate Glass (USG).

Red (R), green (G) and blue (B) color filter layers 214 can be formed on the color filter isolation layer 212 and the second interlayer dielectric layer 211.

Here, the color filter isolation layer 212 can be formed such that each color filter layer 214 can be divided. As shown in FIG. 4, the color filter isolation layer 212 may have a height thickness smaller than that of the color filter layer 214. Because of the height difference, a portion of the G color filter layer and the B color filter layer can be formed on the top surface of one color filter isolation layer 212, and a portion of the B color filter layer and the R color filter layer can be formed on the top surface of another color filter isolation layer 212.

After forming the color filter isolation layer 212, isolation layer spacers 213 including USG can be formed at the sides of the color filter isolation layer 212.

Therefore, the R, G and B color filter layers 214 can be separated from each other by the combined width of the color filter isolation layers 212 and the isolation layer spacers 213. The R, G and B color filter layers 214 can be formed on the second interlayer dielectric layer 211, color filter isolation layer 212, and isolation layer spacers 213 to correspond to each N− type diffusion area 205.

After that, a planar layer 215 can be formed on the entire surface of the semiconductor substrate 200 including the color filter layers 214.

Then, microlenses 216 can be formed on the planar layer 215, and the microlenses 216 are placed such that the incident light transmitting the microlens is incident into the color filter layers 214.

Here, reference numeral 207 is a source and drain impurity area of the transistor.

FIG. 5a through FIG. 5e are sectional views showing the procedure for manufacturing a CMOS image sensor according to the first embodiment of the present invention.

Figure 5A:
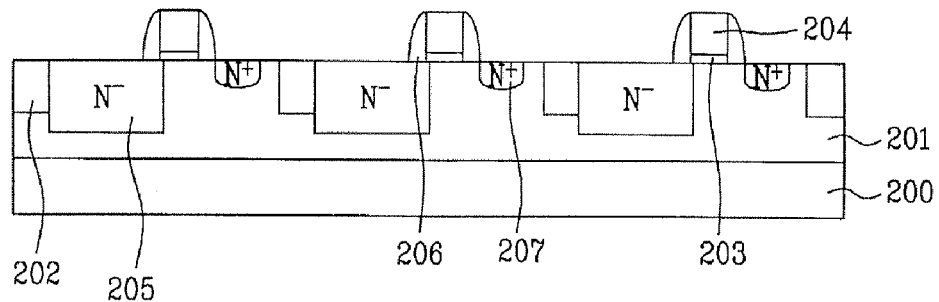
FIG. 5a through FIG. 5e are sectional views showing the procedure for manufacturing a CMOS image sensor according to the first embodiment of the present invention.

As shown in FIG. 5a, an epitaxial process can be performed relative to a semiconductor substrate 200 of a high-density first conductive (P++ type) multi-crystalline silicon, thereby forming a low-density first conductive (P− type) epitaxial layer 201.

Here, the epitaxial layer 201 enlarges and deepens a depletion region of the photodiode, thereby increasing the capability and the photo sensitivity of a low-voltage photodiode for collecting optical charges.

Then, a photodiode area, a transistor area and an isolation area can be defined on the semiconductor substrate 200, and a STI process or a LOCOS process can be performed, thereby forming an isolation layer 202 on the isolation area.

After that, a gate insulating layer 203 and a conductive layer such as a poly-silicon layer or a high-density multi-crystalline silicon layer can be sequentially deposited on the entire surface of the epitaxial layer 201 having the isolation layer 202, and the poly-silicon layer and the gate insulating layer can be selectively removed to form gate electrodes 204 of each transistor.

Here, the gate insulating layer 203 can be formed through a thermal oxidation process or a chemical vapor deposition (CVD) process. In one embodiment, the gate electrode can also include silicide by further forming a silicide layer on the conductive layer.

A thermal oxidation layer (not shown) can be formed by performing a thermal oxidation process on the surface of the gate electrode 204 and the semiconductor substrate 200.

In addition, the width of the gate electrode 204 can be formed wider than that of a conventional gate electrode so as to reflect the increased rate of thickness of the thermal oxidation layer.

Then, second conductive type (N-type) dopants can be implanted into the photodiode area of the semiconductor substrate 200, thereby forming an N-type diffusion area 205.

After that, an insulating layer can be formed on the entire surface of the semiconductor substrate 200, and then gate spacers 206 can be formed at both sides of the gate electrode 204 through an etch-back process.

Thereafter, high-density second conductive type (N+ type) dopants can be implanted into the transistor area of the semiconductor substrate 200, thereby forming a high-density N+ type diffusion area 207.

In an embodiment, before forming the high-density N+ type diffusion area 207, an N− type diffusion area (not shown) can be formed in the transistor area by implanting dopants having lower ion implanting energy than the N-type diffusion area 205.

In a further embodiment, a heat treatment process (such as a rapid thermal treatment process) can be performed relative to the semiconductor substrate 200, thereby diffusing dopants in the N-type diffusion area 205 and the high-density N+ type diffusion area 207.

Figure 5B:
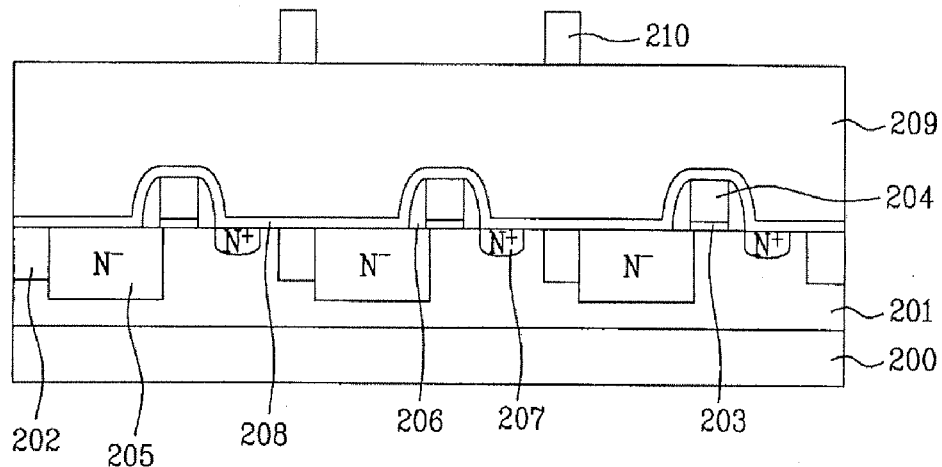

Referring to FIG. 5b, a diffusion stopping nitride layer 208 can be formed on the entire surface of the semiconductor substrate 200.

Then, a first interlayer dielectric layer 209 can be formed on the diffusion blocking nitride layer 208.

Here, the first interlayer dielectric layer 209 may include a silane-based insulating layer. In this case, since a large amount of hydrogen ions exist in the insulating layer; a dangling bond of the semiconductor substrate 200 can be recovered, so it is possible to efficiently decrease a dark current.

Then, a metal layer can be deposited on the first interlayer dielectric layer 209, and can be selectively etched by photo and etching processes, thereby forming various metal interconnections 210.

Figure 5C:
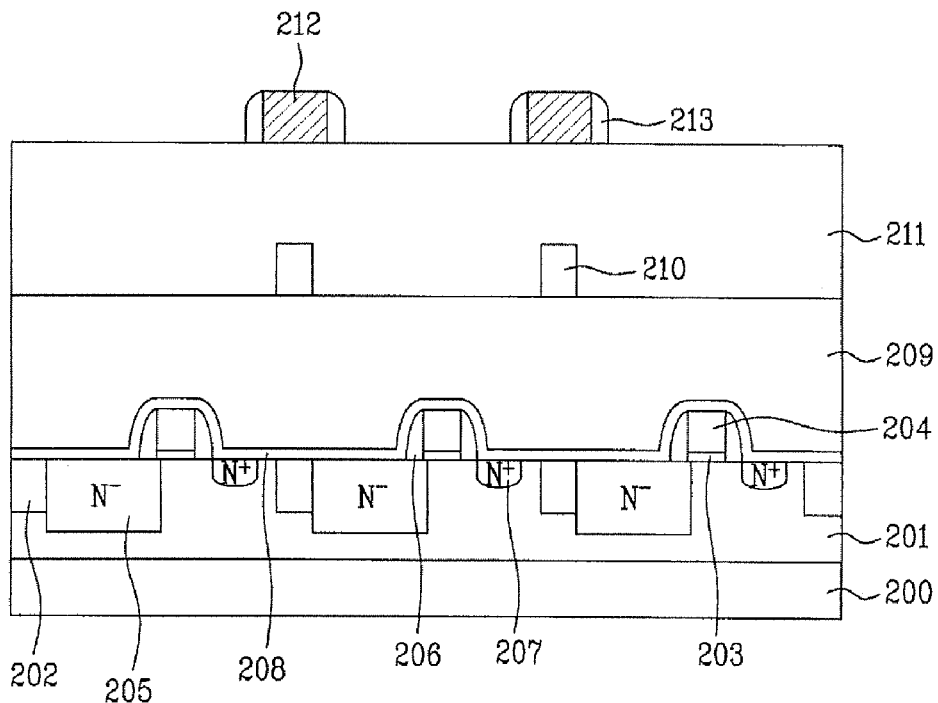

Referring to FIG. 5c, a second interlayer dielectric layer 211 can be formed on the first interlayer dielectric layer 209 including the metal interconnections 210. The second interlayer dielectric layer 211 can have a thickness in a range of 3000 Å to 4000 Å.

In an embodiment, the second interlayer dielectric layer 211 can be formed of USG (Undoped Silicate Glass), PSG, BSG or BPSG.

Then, a first USG layer can be formed on the second interlayer dielectric layer 211, and can be selectively patterned by photo and etching processes so as to form a color filter isolation layer 212 on the second interlayer dielectric layer 211 between N-type diffusion areas 205.

After that, a second USG layer can be formed on the entire surface of the semiconductor substrate 200 including the color filter isolation layer 212. An etch-back process can be performed to form isolation layer spacers 213 at both sides of the color filter isolation layer 212.

The color filter isolation layer 212 and the isolation layer spacer 213 are formed at the boundaries of each color filter, which are formed in a subsequent process. According to an embodiment of the present invention, both the color filter isolation layer 212 and the isolation layer spacer 213 are formed, and they can be formed at a desired area by selectively patterning one USG layer such that they can be used as an isolation layer of each color filter layer.

Figure 5D:
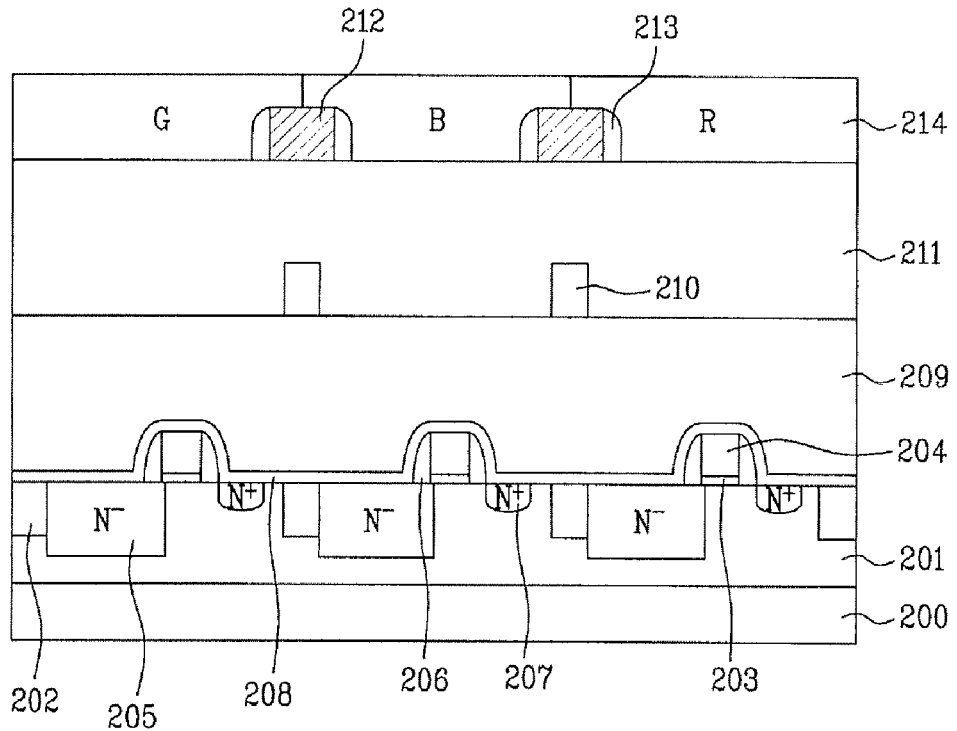

Referring to FIG. 5d, red (R), blue (B) and green (G) color filter layers 214 can be formed such that they are separated from each other by the color filter isolation layers 212 and the isolation layer spacers 213 while corresponding to each N− type diffusion area 205.

Each color filter layer 214 can be formed by coating the substrate with a dyeable resist, and performing exposure and development processes so as to form color filter layers that filter light of specific wavelength bands.

Material having photosensitive properties can be coated for each color filter layer 214 at a thickness of 1 μm to 5 μm. The color filter layer 214 can be patterned through a photolithography process using an additional mask, thereby forming the single color filter layer for filtering light of specific wavelength bands.

Figure 5E:
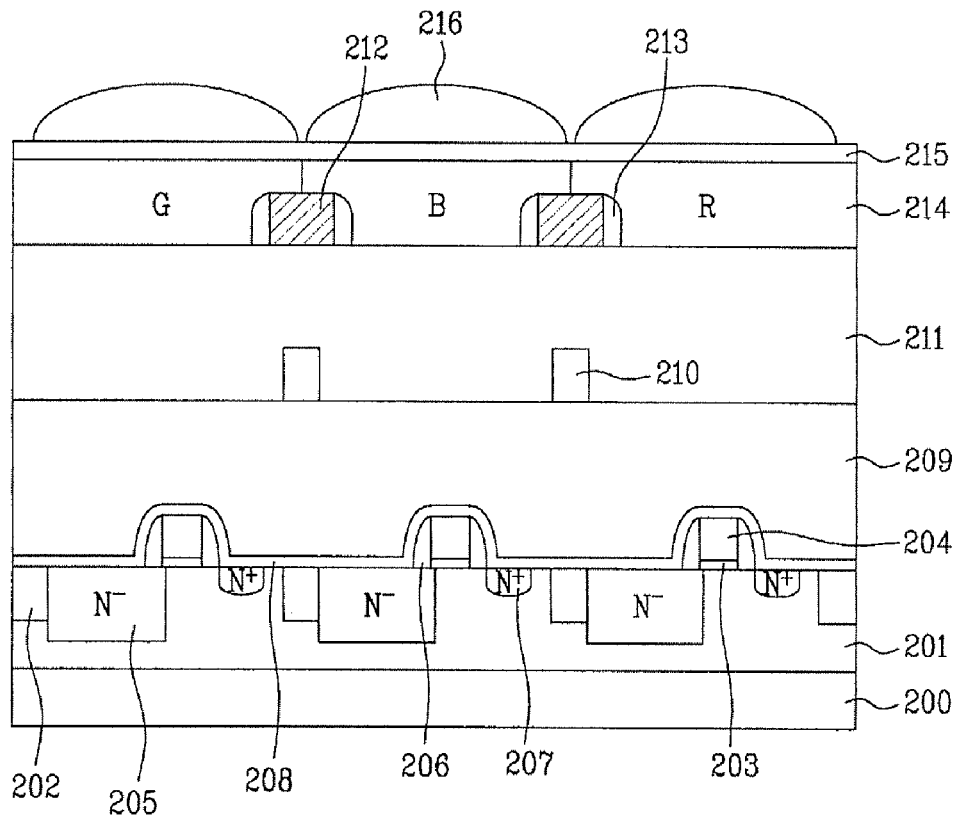

Referring to FIG. 5e, a planar layer 215 can be formed on each color filter layer 214.

In an embodiment, the planar layer 215 can be formed on each color filter layer 214 by depositing a silicon nitride layer, so as to improve the reliability and to prevent the EMC when packaging and to prevent the penetration of moistures or heavy metals from exterior.

Then, a CMP or an etch-back process can be performed relative to the entire surface of the planar layer 215, thereby decreasing the thickness of the planar layer 215 to a predetermined thickness from the top surface.

Meanwhile, since an optical transmittance is very important in an image sensor, the planar layer 215 can be formed to have a thickness in the range of 1000 Å to 6000 Å in order to prevent the interference of layers caused by the thickness of the planar layer 215.

After that, a microlens photoresist can be coated on the entire surface of the semiconductor 200 including the planar layer 215 for forming microlenses to efficiently collect the light at the N-type diffusion area 205.

Then, exposure and development processes can be performed so as to selectively pattern the photoresist, thereby forming a microlens pattern.

If the photoresist is a positive resist, the transmittance is improved only when a photo active compound of an initiator, which is an absorbent of the photoresist, is decomposed. Thus, the photo active compound remaining in the microlens pattern is decomposed through a flood exposure.

As described above, the transmittance is improved by performing a flood exposure relative to the microlens pattern, and the flow ability of the microlens is improved by generating photo acid.

In addition, a heat treatment process can be performed at a temperature of 200° C. to 700° C. while placing the semiconductor substrate 200 including the microlens pattern on a hot plate (not shown) to reflow the microlens pattern, thereby forming a hemispherical microlens 216.

After that, a cooling process can be performed relative to the microlens 216. Here, the cooling process can be performed while the semiconductor substrate 200 is placed on a cool plate.

Figure 6:
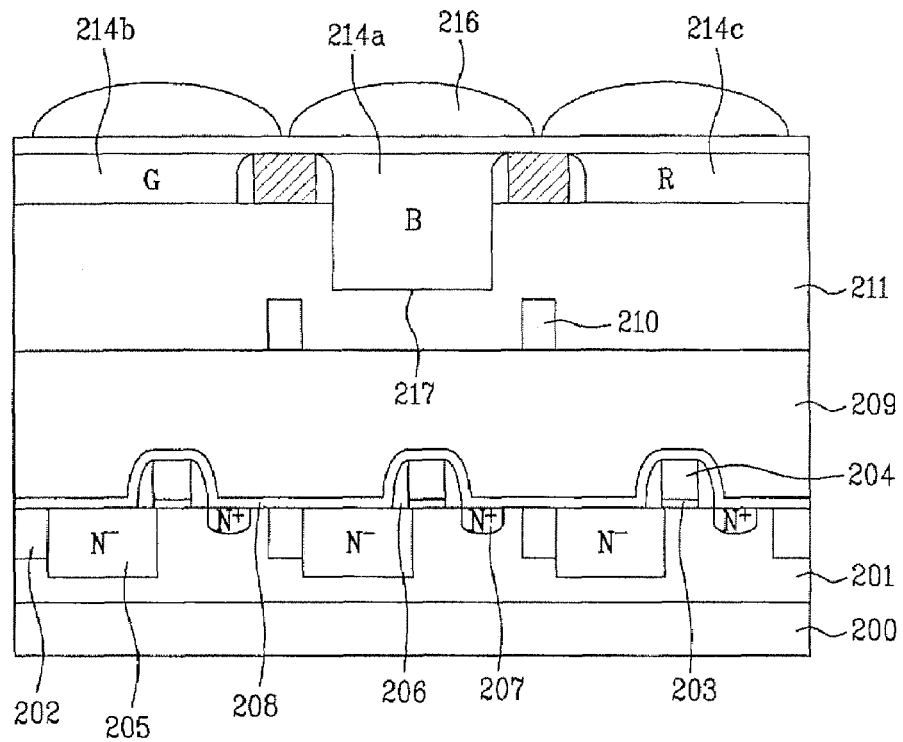
FIG. 6 is a sectional view showing a CMOS image sensor according to a second embodiment of the present invention.

FIG. 6 is a sectional view showing a CMOS image sensor according to a second embodiment of the present invention.

Referring to FIG. 6, an isolation area and an active area having a photodiode area and a transistor area can be defined on a P++ type semiconductor substrate 200, and a P− type epitaxial layer 201 can be formed on the semiconductor substrate 200.

Then, an isolation layer 202 can be formed on the isolation area of the semiconductor substrate 200 to separate the incident area of the green, red and blue light, and an N-type diffusion area 205 can be formed on the photodiode area of the semiconductor substrate 200.

Thereafter, gate insulating layers 203 and gate electrodes 204 can be formed on the transistor area of the semiconductor substrate 200, and gate spacers 206 can be formed at both sides of the gate electrode 204. Then, a diffusion blocking nitride layer 208 can be formed on the entire surface of the semiconductor substrate 200 including the gate electrode 204.

Then, a first interlayer dielectric layer 209 can be formed on the diffusion blocking nitride layer 208, and various metal interconnections 210 can be formed on the first interlayer dielectric layer 209. The metal interconnections 210 can be spaced apart from each other by a predetermined interval.

In addition, a second interlayer dielectric layer 211 can be formed on the entire surface of the semiconductor substrate 200 including the metal interconnections 210, and color filter isolation layers 212 and isolation layer spacers 213 can be formed on the second interlayer dielectric layer 211 corresponding to each N− type diffusion area 205.

R, G and B color filter layers 214a, 124b and 124c can be separated from each other by the color filter isolation layers 212 and the isolation layer spacers 213, and can be formed corresponding to each N− type diffusion area 205. Then, a planar layer 215 can be formed on the entire surface of the semiconductor substrate 200 including the color filter layers 214a, 124b and 124c.

Herein, the blue color filter layer 214a can be formed in a trench 217 having a predetermined depth from the surface of the second interlayer dielectric layer 211, and each color filter layer 214a, 124b and 124c can be formed having a same height as a top surface of the color filter isolation layer 212.

Microlenses 216 can be formed on the planar layer 215 corresponding to color filter layers 214a, 124b and 124c.

Here, reference numeral 207, not yet described is a source and drain impurity area of a transistor.

FIG. 7a through FIG. 7g are sectional views showing a procedure for manufacturing a CMOS image sensor according to the second embodiment of the present invention.

Figure 7A:
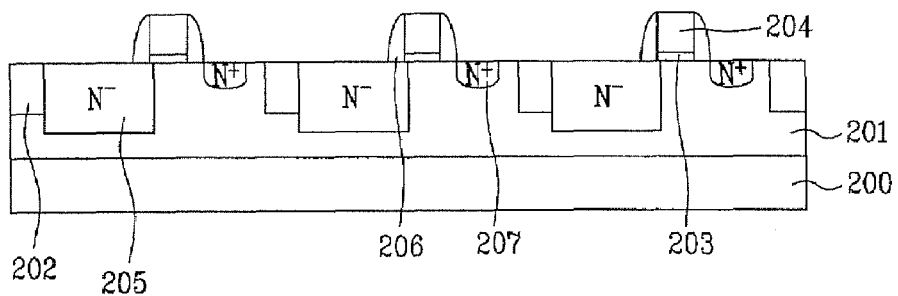
FIG. 7a through FIG. 7g are sectional views showing the procedure for manufacturing a CMOS image sensor according to the second embodiment of the present invention.

Referring to FIG. 7a, an epitaxial process can be performed relative to a semiconductor substrate 200 of a high-density first conductive (P++ type) multi-crystalline silicon, thereby forming a low-density first conductive (P− type) epitaxial layer 201.

Here, the epitaxial layer 201 enlarges and deepens a depletion region of the photodiode, thereby increasing the capability and the photo sensitivity of a low-voltage photodiode for collecting optical charges.

Then, a photodiode area, a transistor area and an isolation area can be defined on the semiconductor substrate 200, and a STI process or a LOCOS process can be performed to form an isolation layer 202 on the isolation area.

After that, a gate insulating layer 203 and a conductive layer such as a poly-silicon layer or a high-density multi-crystalline silicon layer can be sequentially deposited on the entire surface of the epitaxial layer 201 formed with the isolation layer 202, and can be selectively removed to form gate electrodes 204 of each transistor.

Here, the gate insulating layer 203 can be formed through a thermal oxidation process or a CVD process. The gate electrode can be formed including a silicide by further forming a silicide layer on the conductive layer.

A thermal oxidation layer (not shown) can be formed by performing a thermal oxidation process on the surface of the gate electrode 204 and the semiconductor substrate 200.

In addition, the width of the gate electrode 204 can be formed wider than that of a conventional gate electrode to reflect the increased rate of thickness of the thermal oxidation layer.

Then, second conductive type (N-type) dopants can be implanted into the photodiode area of the semiconductor substrate 200, thereby forming an N-type diffusion area 205.

After that, an insulating layer can be formed on the entire surface of the semiconductor substrate 200, and then gate spacers 206 can be formed at both sides of the gate electrode 204 through an etch-back process.

Thereafter, high-density second conductive type (N+ type) dopants can be implanted into the transistor area of the semiconductor substrate 200, thereby forming a high-density N+ type diffusion area 207.

A heat treatment process (such as a rapid heat treatment process) can be performed relative to the semiconductor substrate 200, thereby diffusing dopants in the N-type diffusion area 205 and the high-density N+ type diffusion area 207.

In one embodiment, before forming the high-density N+ type diffusion area 207, an N-type diffusion area (not shown) can be formed in the transistor area by implanting dopants having lower ion implanting energy than the N-type diffusion area 205.

Figure 7B:
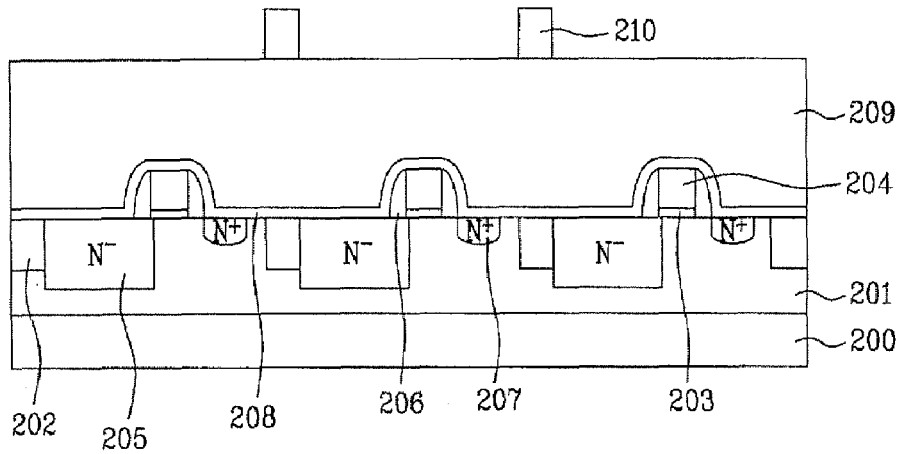

Referring to FIG. 7b, a diffusion blocking nitride layer 208 can be formed on the entire surface of the semiconductor substrate 200.

Then, a first interlayer dielectric layer 209 can be formed on the diffusion blocking nitride layer 208.

Here, the first interlayer dielectric layer 209 may include a silane-based insulating layer. In this case, since a great amount of hydrogen ions exist in the insulating layer; a dangling bond of the semiconductor substrate 200 can be recovered, so it is possible to efficiently decrease a dark current.

Then, a metal layer can be deposited on the first interlayer dielectric layer 209, and can be selectively etched by photo and etching processes, thereby forming various metal interconnections 210.

Figure 7C:
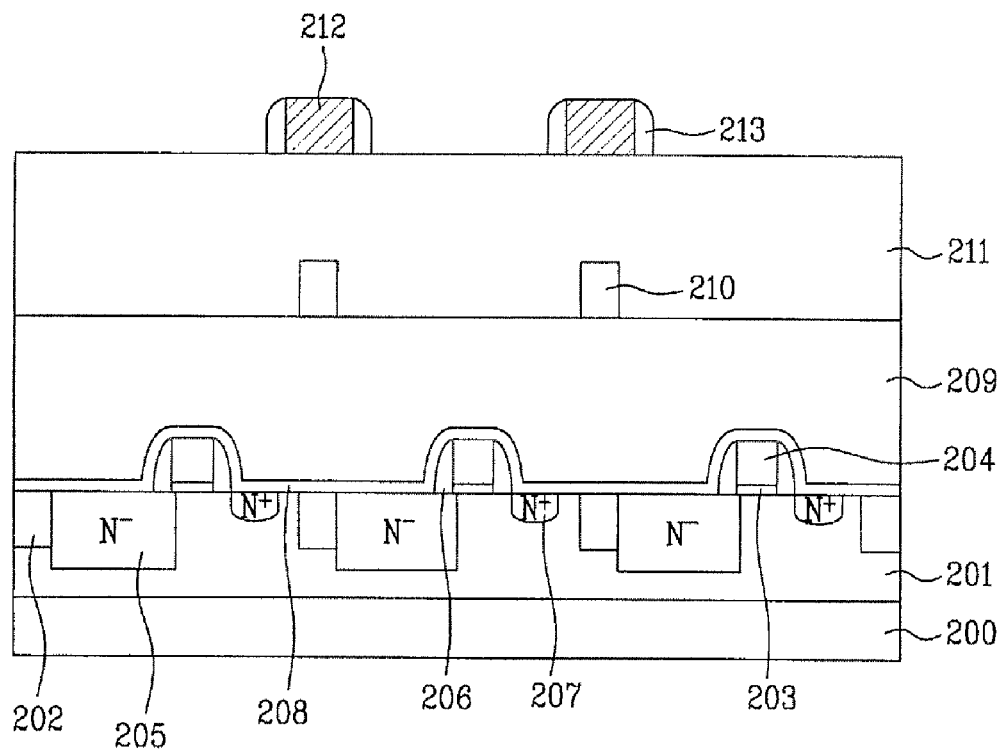

Referring to FIG. 7c, a second interlayer dielectric layer 211 can be formed on the first interlayer dielectric layer 209 including the metal interconnections 210. The second interlayer dielectric layer 211 can have a thickness in a range of 3000 Å to 4000 Å.

Here, the second interlayer dielectric layer 211 can be formed of USG (Undoped Silicate Glass), PSG, BSG or BPSG.

Then, a first USG layer can be formed on the second interlayer dielectric layer 211, and can be selectively patterned by photo and etching processes so as to form a color filter isolation layer 212 on the second interlayer dielectric layer 211 between N-type diffusion areas 205.

After that, a second USG layer can be formed on the entire surface of the semiconductor substrate 200 including the color filter isolation layer 212, and an etch-back process can be performed to form isolation layer spacers 213 at both sides of the color filter isolation layer 212.

The color filter isolation layer 212 and the isolation layer spacer 213 are formed at the boundaries of each color filter, which are formed in a subsequent process. According to an embodiment of the present invention, both the color filter isolation layer 212 and the isolation layer spacer 213 are formed, but they can be formed at a desired area by selectively patterning one USG layer, and can be used as an isolation layer of each color filter layer.

Figure 7D:
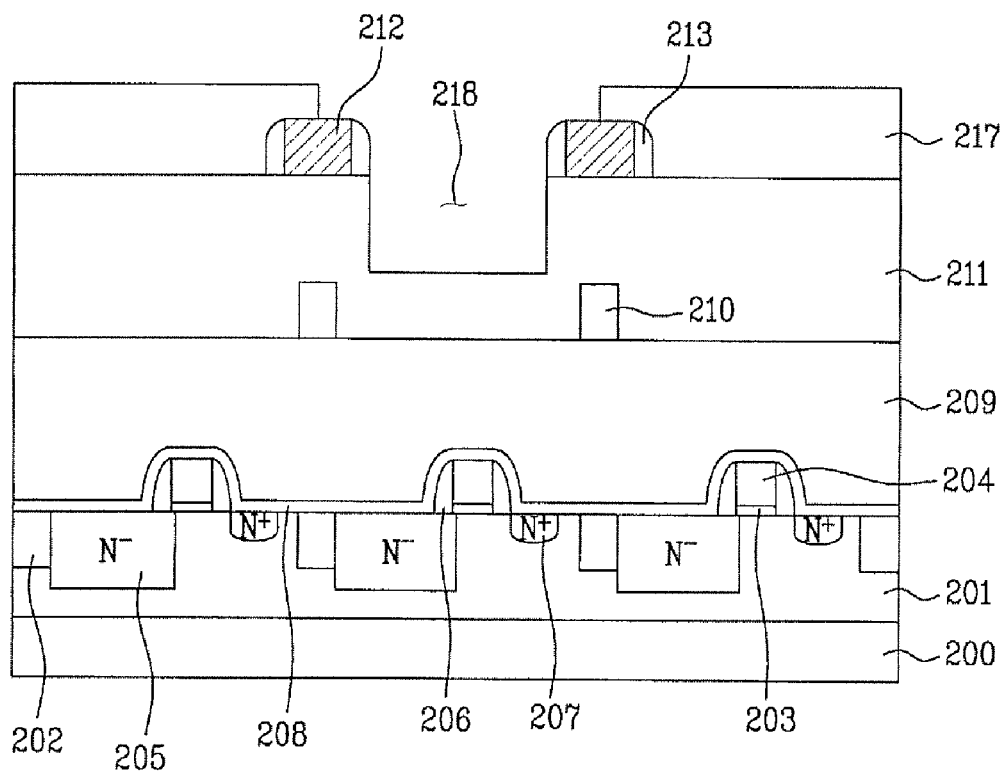

Referring to FIG. 7d, a photoresist film 217 can be coated on the entire surface of the semiconductor substrate 200 including the color filter isolation layers 212 and the isolation layer spacers 213. Then, exposure and development processes can be performed relative to the photoresist film such that a portion, where the blue color filter will be formed, can be opened.

Then, the second interlayer dielectric layer 211 can be selectively removed using the patterned photoresist film 217 as a mask, thereby forming a trench 218 having a predetermined depth from the surface of the second interlayer dielectric layer.

Figure 7E:
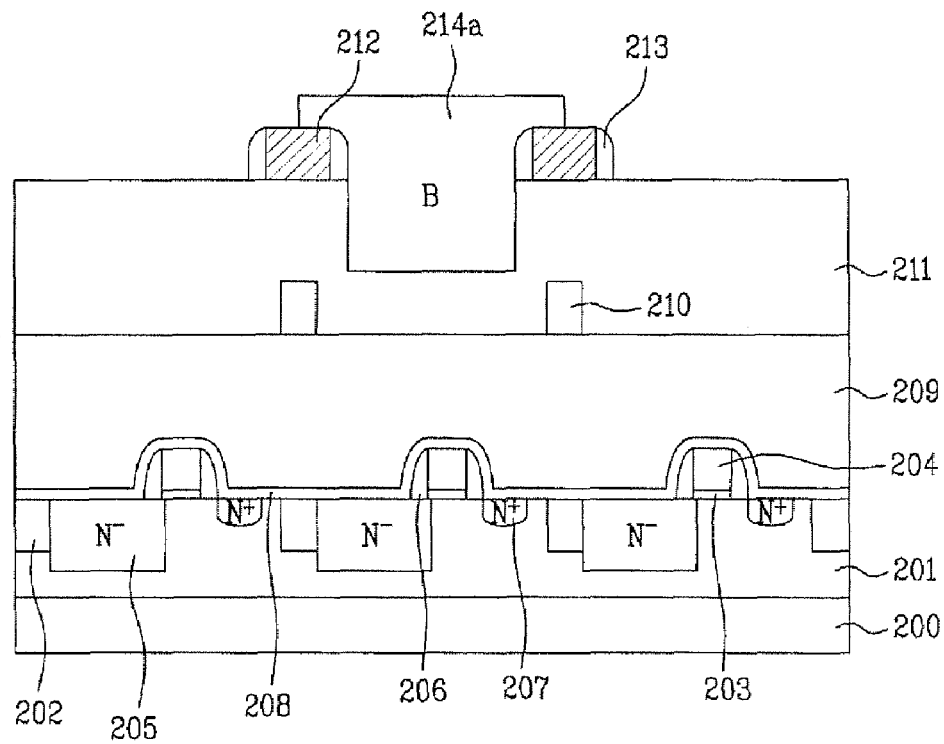

Referring to FIG. 7e, after removing the photoresist film 217, a blue dyeable resist can be coated on the substrate. Then, exposure and development processes can be performed relative to the resist such that it remains in the trench 218 and on a portion of the color filter isolation layers 212 and the isolation layer spacers 213 adjacent to the trench, thereby forming a blue color filter layer 214a.

Figure 7F:
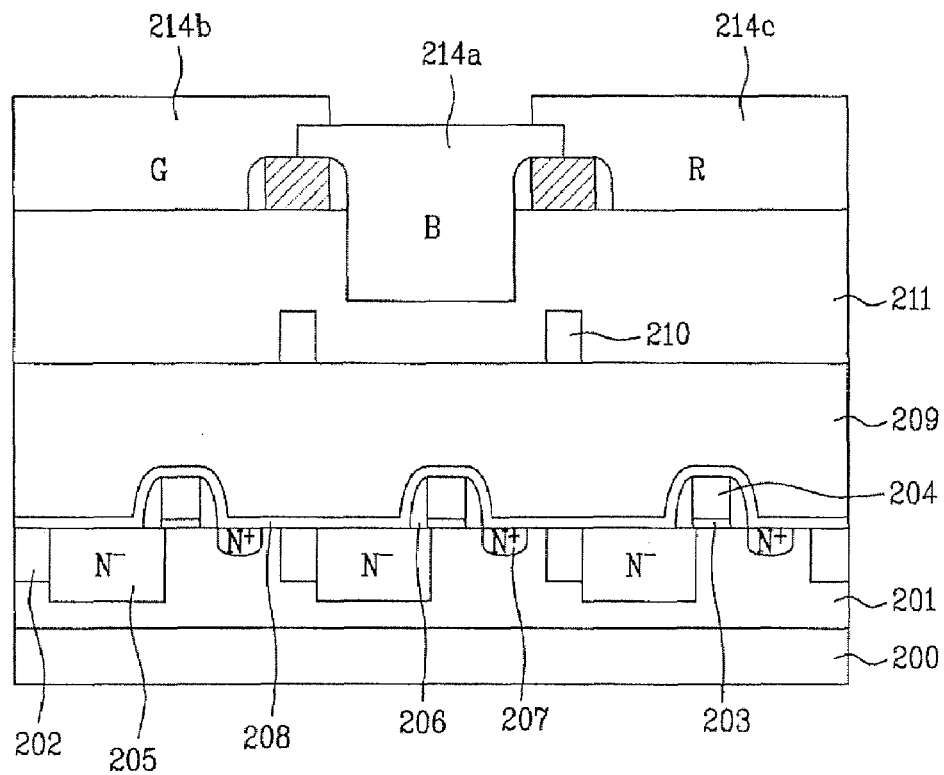

Referring to FIG. 7f, dyeable resist can be coated on areas adjacent to the blue color filter layer 214a; thereby forming a green color filter layer 214b and a red color filter layer 214c.

Figure 7G:
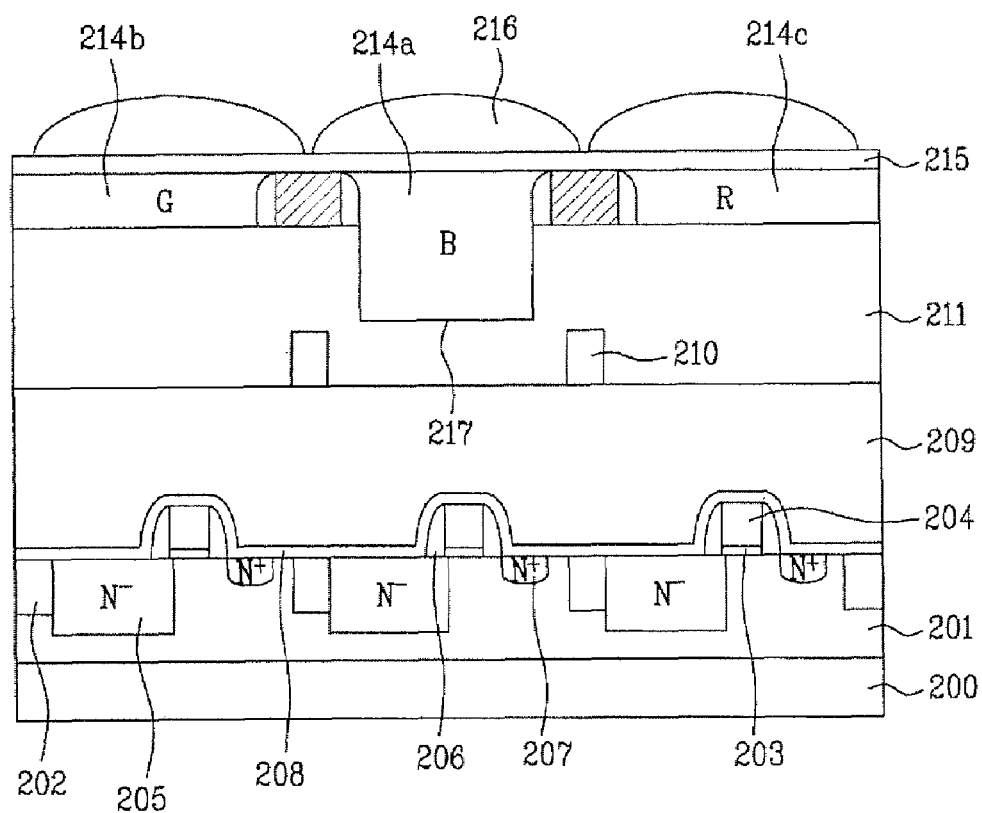

Referring to FIG. 7g, a planarization process such as a CMP is performed on the entire surface of the color filter isolation layers to planarize the color filter layers 214a, 214b and 214c. At this time, the top surface of the color filter isolation layer 212 serves as an end point of the planarization process. FIG. 7g shows an embodiment further including a planar layer 215.

Here, even though the planar layer 215 can be formed as illustrated in FIG. 7g, the additional planar layer can be omitted because the planarization process can be performed as described above.

After that, a microlens photoresist is coated on the entire surface of the semiconductor 200 including the planar layer 215, so as to efficiently collect the light at the N-type diffusion area 205.

Then, the exposure and development process is performed so as to selectively pattern the photoresist, thereby forming a microlens pattern.

If the photoresist is a positive resist, the transmittance is improved only when a photo active compound of an initiator, which is an absorbent of the photoresist, is decomposed. Thus the photo active compound remaining in the microlens pattern is decomposed through a flood exposure.

Meanwhile, as described above the transmittance is improved by performing a flood exposure relative to the microlens pattern, and the flow ability of the microlens is improved by generating photo acid.

Subsequently, a heat treatment process can be performed at a temperature of 200° C. to 700° C. while placing the semiconductor substrate 200 including the microlens pattern on top of a hot plate (not shown) to reflow the microlens pattern, thereby forming a hemispherical microlens 216.

After that, a cooling process can be performed relative to the microlens 216. Here, the cooling process can be performed while the semiconductor substrate 200 is placed on a cool plate.

As described above, embodiments of the CMOS image sensor and the method for manufacturing the same according to the present invention have the following advantages.

The overlapping at the boundaries of each color filter layer can be prevented, and the thickness of each color filter layer can be uniformly formed. Accordingly, the color reproduction can be improved.

It should be understood that the examples and embodiments described herein are for illustrative purposes only and that various modifications or changes in light thereof will be suggested to persons skilled in the art and are to be included within the spirit and purview of this application.

I claim:

1. A CMOS image sensor, comprising:
   an interlayer dielectric layer formed on a semiconductor substrate;
   a plurality of color filter isolation layers formed on the interlayer dielectric layer;
   isolation layer spacers having a predetermined thickness formed at sidewalls of the plurality of color filter isolation layers;
   a color filter layer comprising a first color filter, a second color filter, and a third color filter formed on the interlayer dielectric layer, wherein a portion of the first color filter and a portion of the second color filter are formed on a top surface of one of the plurality of color filter isolation layers, and wherein a portion of the second color filter and a portion of the third color filter are formed on a top surface of another of the plurality of color filter isolation layers; and
   microlenses formed on the color filter layer.

2. The CMOS image sensor according to claim 1, wherein the plurality of color filter isolation layers comprise USG (Undoped Silicate Glass).

3. The CMOS image sensor according to claim 1, wherein the isolation layer spacers comprise USG.

4. The CMOS image sensor according to claim 1, further comprising a planarization layer formed on the color filter layer between the color filter layer and the microlenses.

5. The CMOS image sensor according to claim 1, wherein the first color filter is a red (R) color filter layer, the second color filter is a blue (B) color filter layer, and the third color filter is a green (G) color filter layer.

6. The CMOS image sensor according to claim 1, wherein each color filter of the color filter layer has a same height.

7. The CMOS image sensor according to claim 1, wherein the interlayer dielectric layer comprises:
   a first interlayer dielectric layer formed on the semiconductor substrate; and
   a second interlayer dielectric layer formed on the first interlayer dielectric layer and having a trench formed at a predetermined area of the second interlayer dielectric layer,
   wherein the color filter layer is formed on the second interlayer dielectric layer and at least a portion of the color filter layer is formed in the trench.

8. A CMOS image sensor comprising:
   an interlayer dielectric layer formed on a semiconductor substrate;
   color filter isolation layers formed on the interlayer dielectric layer and spaced apart from each other by a predetermined interval so as to correspond with a gap between photodiodes formed on the semiconductor substrate, wherein the color filter isolation layers comprise an insulating material;
   a trench having a predetermined depth formed in the interlayer dielectric layer between two adjacent color filter isolation layers;
   a blue color filter layer formed in the trench;
   a green color filter layer and a red color filter layer formed on the interlayer dielectric layer and separated from each other and the blue color filter layer by the color filter isolation layers; and
   microlenses formed on the blue color filter layer, green color filter layer, and red color filter layer.

9. The CMOS image sensor according to claim 8, further comprising a planarization layer formed on the blue, green, and red color filter layers.

10. The CMOS image sensor according to claim 8, wherein the color filter isolation layers and the blue, green, and red color filter layers are formed to the same thickness height above the interlayer dielectric layer.

11. The CMOS image sensor according to claim 8, further comprising isolation layer spacers formed on sidewalls of the color filter isolation layers.

12. The CMOS image sensor according to claim 11, wherein the color filter isolation layers and the isolation layer spacers comprise USG.

13. A method for manufacturing a CMOS image sensor, the method comprising:
   forming an interlayer dielectric layer on a semiconductor substrate;
   forming color filter isolation layers on the interlayer dielectric layer spaced apart from each other by a predetermined interval, wherein the color filter isolation layers comprise an insulating material;
   forming a trench having a predetermined depth from a surface of the interlayer dielectric layer by selectively removing a predetermined area of the interlayer dielectric layer between two adjacent color filter isolation layers;
   forming a blue color filter layer in the trench;
   forming a green color filter layer and a red color filter layer on the interlayer dielectric layer;
   planarizing a top portion of the blue, green, and red color filter layers, wherein a top surface of the color filter isolation layers serves as an end point of the planarization process; and
   forming microlenses on the blue, green, and red color filter layers.

14. The method according to claim 13, wherein forming the color filter isolation layers comprises:
   depositing USG on the interlayer dielectric layer, and
   selectively patterning the USG to form a USG pattern spaced apart by the predetermined interval.

15. The method according to claim 13, further comprising forming isolation layer spacers comprised of USG at sidewalls of the color filter isolation layers after forming the color filter isolation layers.

16. The method according to claim 13, further comprising forming a planar layer on the blue, green, and red color filter layers after planarizing the top portion of the blue, green, and red color filter layers.

* * * * *